US011084224B2

(12) United States Patent
Zydzik et al.

(10) Patent No.: US 11,084,224 B2
(45) Date of Patent: Aug. 10, 2021

(54) THREE DIMENSIONAL INFILL IN ADDITIVE MANUFACTURING

(71) Applicant: Arevo, Inc., Milpitas, CA (US)

(72) Inventors: Magda Helena Zydzik, Mountain View, CA (US); Sohil Nandu, Sunnyvale, CA (US)

(73) Assignee: Arevo, Inc., Milpitas, CA (US)

( * ) Notice: Subject to any disclaimer, the term of this patent is extended or adjusted under 35 U.S.C. 154(b) by 88 days.

(21) Appl. No.: 16/279,937

(22) Filed: Feb. 19, 2019

(65) Prior Publication Data

US 2020/0262149 A1 Aug. 20, 2020

(51) Int. Cl.
| | |
|---|---|
| *G05B 19/4099* | (2006.01) |
| *B29C 64/393* | (2017.01) |
| *B29C 64/118* | (2017.01) |
| *G06F 30/23* | (2020.01) |
| *B33Y 80/00* | (2015.01) |
| *B33Y 10/00* | (2015.01) |
| *B33Y 30/00* | (2015.01) |
| *B33Y 50/02* | (2015.01) |

(52) U.S. Cl.
CPC .......... *B29C 64/393* (2017.08); *B29C 64/118* (2017.08); *G05B 19/4099* (2013.01); *G06F 30/23* (2020.01); *B33Y 10/00* (2014.12); *B33Y 30/00* (2014.12); *B33Y 50/02* (2014.12); *B33Y 80/00* (2014.12)

(58) Field of Classification Search
None
See application file for complete search history.

(56) References Cited

U.S. PATENT DOCUMENTS

| | | | |
|---|---|---|---|
| 10,096,156 B2 | 10/2018 | Tanaka et al. | |
| 10,118,336 B2 | 11/2018 | Pla et al. | |
| 10,137,646 B2 | 11/2018 | Stevens et al. | |
| 10,157,500 B2 | 12/2018 | Gritzky et al. | |
| 10,181,216 B2 | 1/2019 | Zeng et al. | |
| 10,452,053 B2* | 10/2019 | Lalish | B29C 64/393 |
| 2005/0154481 A1* | 7/2005 | Berger | B33Y 50/00 |
| | | | 700/98 |
| 2011/0205583 A1* | 8/2011 | Young | G06T 19/20 |
| | | | 358/1.15 |
| 2012/0010741 A1* | 1/2012 | Hull | B33Y 40/00 |
| | | | 700/98 |

(Continued)

*Primary Examiner* — Jason Lin
(74) *Attorney, Agent, or Firm* — Peter H Priest; Kenneth Ottesen (57) ABSTRACT

An article of manufacture is disclosed that includes an infill generated utilizing three dimensional (3D) printing. Infill is generated utilizing segments of filament, such as, but not limited to continuous carbon fiber-reinforced thermoplastic filament. Other materials may also be suitably employed. Approaches to tool path generation which accomplish the 3D printing desired are addressed in which material runs of filament are applied that distribute where cuts, beginning, or ends of segments occur or points where ends of segments are anchored to the article to form the desired infill. Aspects of one approach include first generating a meta tool path for the infill and then adapting that tool path to an actual infill tool path by pruning any segments in the meta tool path extending outside the perimeter of the article and identifying anchor points to the article from observed intersections of the meta tool path and said perimeter.

19 Claims, 8 Drawing Sheets

(56) References Cited

U.S. PATENT DOCUMENTS

| | | | | |
|---|---|---|---|---|
| 2014/0039659 A1* | 2/2014 | Boyer | B29C 64/386 | |
| | | | 700/98 | |
| 2016/0016360 A1* | 1/2016 | Voris | B29C 64/386 | |
| | | | 264/129 | |
| 2016/0059485 A1* | 3/2016 | Ding | B29C 64/20 | |
| | | | 264/401 | |
| 2016/0288426 A1* | 10/2016 | Yoshida | B33Y 30/00 | |
| 2016/0311165 A1* | 10/2016 | Mark | B33Y 70/00 | |
| 2016/0346999 A1* | 12/2016 | Patrov | B29C 64/386 | |
| 2016/0370791 A1* | 12/2016 | Revanur | B33Y 50/02 | |
| 2017/0036395 A1* | 2/2017 | Sanz | B29C 70/70 | |
| 2017/0038765 A1* | 2/2017 | Yoshida | B29C 64/393 | |
| 2017/0176979 A1* | 6/2017 | Lalish | B29C 64/386 | |
| 2018/0071986 A1* | 3/2018 | Buller | B29C 64/20 | |
| 2018/0196407 A1* | 7/2018 | Lee | G05B 19/4099 | |
| 2018/0229446 A1* | 8/2018 | Bastian | G06F 30/00 | |
| 2018/0229448 A1* | 8/2018 | Bastian | B33Y 50/02 | |
| 2018/0373227 A1* | 12/2018 | Sadusk | G06T 19/20 | |
| 2019/0011902 A1* | 1/2019 | Su | G06T 19/20 | |
| 2019/0134915 A1* | 5/2019 | Schmidt | B29C 64/386 | |
| 2019/0197773 A1* | 6/2019 | Schmidt | G06T 17/20 | |

* cited by examiner

FIG. 7

THREE DIMENSIONAL INFILL IN ADDITIVE MANUFACTURING

TECHNICAL FIELD

The present invention relates generally to aspects of additive manufacturing of three-dimensional articles, and, more particularly, to improved techniques for fabricating articles of manufacture employing advantageous approaches to generate three dimensional infill as addressed further herein.

BACKGROUND

In general, there are two complementary approaches to fabricate an article of manufacture: additive manufacturing and subtractive manufacturing.

Additive manufacturing involves aggregating material to form the desired article of manufacture. In contrast, subtractive manufacturing involves removing material to form the desired article of manufacture. In practice, many articles of manufacture are fabricated using a combination of additive and subtractive techniques.

A form of additive manufacturing—colloquially known as "3D printing"—is the subject of intense research and development because it enables the fabrication of articles of manufacture with complex geometries. Furthermore, 3D printing enables the mass customization of articles of manufacture with different dimensions and characteristics with a variety of infills. See, for example, U.S. patent application Ser. No. 15/899,361, filed Feb. 19, 2018, entitled "Hexagonal Sparse Infill Made of Linear Segments of Filament," and U.S. patent application Ser. No. 15/899,360, filed Feb. 19, 2018, entitled "Quadrilateral Sparse Infill Made of Linear Segments of Filament", both of which are assigned to the assignee of the present application and incorporated by reference in their entirety. There remain, however, many challenges in the design, manufacture, and use of 3D printers, as well as, in the advancement of 3D printing processes.

Consider the task of designing an article to be sufficiently strong to resist a wide array of forces encountered in real world usage, but lightweight. An article of a given material, a given external geometry, and a solid interior is typically stronger than an article with a hollow interior. In contrast, an article of a given material, a given external geometry, and a hollow interior is typically lighter than an article with a solid interior.

There are, however, more options for the interior and one such option is a sparse infill. A sparse infill (herein also called an "infill") is a porous, skeletal or cellular structure that is stronger than a hollow interior and lighter in weight than a solid interior.

Infills having a two dimensional pattern are commonly incorporated into articles that are 3D printed, and it is well-known how to make such infills using a 3D printing technology. It is well-known in the prior art how to print a two dimensional infill using ABS with fused-deposition modeling ("FDM").

SUMMARY OF THE INVENTION

The structural integrity of infill may be dependent on the macroscopic properties of some materials. For example, the structural integrity of an infill made of fiber-reinforced thermoplastic filament is dependent on how the filament is cut up and assembled. Further, for a wide variety of articles of manufacturing, a true three dimensional infill appears to be highly advantageous and desirable. In a true three dimensional infill, a segment of infill is printed with an infill tool path causing deposition head movement in the x, y and z dimensions to print that segment of infill providing as one advantage that fiber reinforcement can be oriented more optimally with respect to the load a part is expected to experience.

Among its several aspects, the present invention recognizes as a general matter, that it is highly advantageous to provide true three dimensional infill in a manner which fills interior space of three dimensional articles quickly and efficiently to reduce the weight of the completed article while insuring sufficient strength. Further, the present invention recognizes the desirability of repeatable and reliable techniques readily adaptable to interiors of both a wide variety of regularly and irregularly shaped three dimensional articles.

Embodiments of the present invention enable an article to be fabricated with fiber reinforced filament infill that is repeatable and regular as addressed further herein. According to one aspect of the present invention, repeatable three dimensional voxels of predetermined shape and size are employed to establish a bounding box covering an outer boundary of an entire part. Then, a symmetrical pattern defined by the voxels is employed to connect infill anchor points for a meta infill tool path which is generated by connecting the anchor points in a fashion that can be three dimensionally printed. Intersections between the meta infill tool path and the inner boundary of the part, are determined to locate actual anchor points between an actual infill tool path and the part. The portions of the meta infill tool path external to the part are trimmed to leave the actual infill tool path.

A further aspect of the present invention addresses the possible need for particular portions of internal volumes of three dimensional printed articles to have additional infill to provide additional strength. One of the advantages of the present invention is that a voxel like a cube can be further subdivided into smaller cubes and the patterns of the infill tool paths can be made smaller and denser to address such needs quickly and reliably. Alternatively, a particular interior portion of a part may require less infill and the present invention provides a ready technique for making that adjustment as well.

A more complete understanding of the present invention, as well as further features and advantages of the invention, will be apparent from the following Detailed Description and the accompanying drawings.

DETAILED DESCRIPTION

Figure 1:
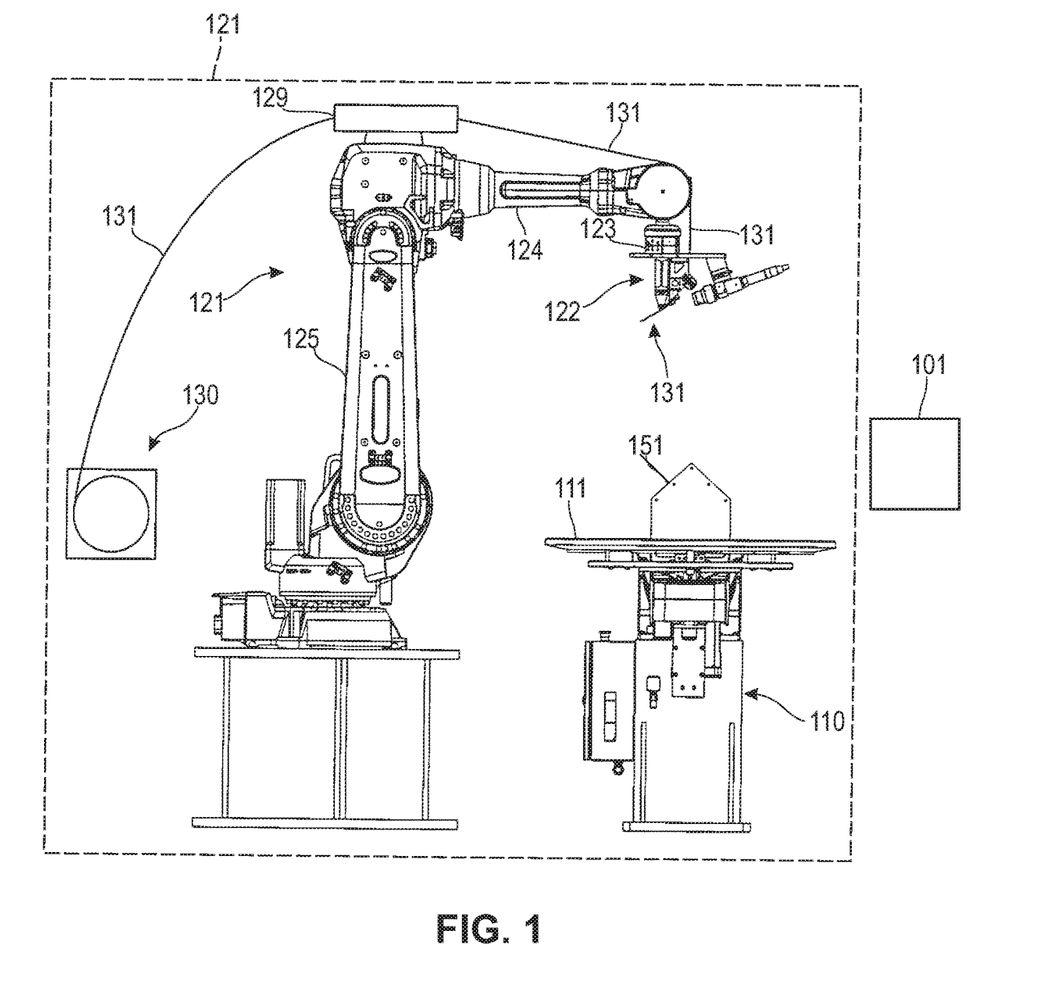
FIG. 1 depicts an illustration of the components of an additive manufacturing system suitably adapted to generate meta infill tool paths, actual infill tool paths and filament three dimensional article printing tool paths in accordance with an illustrative embodiment of the present invention.

FIG. 1 depicts an illustration of the components of an exemplary additive manufacturing system 100 in accordance with the illustrative embodiments of the present invention. Additive manufacturing system 100 comprises: controller 101, turntable 110, deposition build plate 111, robot 121, deposition head 122, filament conditioning unit 129, filament source 130, and thermoplastic filament 131. The purpose of manufacturing system 100 is to fabricate articles of manufacture, such as illustrative article 151 of FIG. 1, as well as the articles of FIGS. 2-5 (a cylinder) and 7 (an irregularly shaped three dimensional object), for example. It will be recognized that the teachings of the present invention are applicable to a wide range of articles of manufacture, as well as materials, and the particular illustrations herein are exemplary.

Controller 101 comprises the hardware and software necessary to direct build chamber 102, robot 121, deposition head 122, and turntable 110, in order to fabricate the article 151 or other desired articles. In light of the present teachings, such as the process flowchart of FIG. 6, it will be clear to those skilled in the art how to program and use controller 101 to generate paths to provide true three dimensional infill in additive manufacturing as addressed further in connection with FIGS. 2-7 below.

Build chamber 102 may suitably be a thermally-insulated, temperature-controlled environment in which an article, such as article 151, is fabricated.

Turntable 110 comprises a stepper motor—under the control of controller 101—that is capable of rotating build plate 111 (and, consequently article 151) around the z-axis (i.e., orthogonal to the build plate). In particular, turntable 110 is capable of:
 i. rotating build plate 111 clockwise around the z-axis from any angle to any angle, and
 ii. rotating build plate 111 counter-clockwise around the z-axis from any angle to any angle, and
 iii. rotating build plate 111 at varying rates, and as desired for a particular application, and
 iv. maintaining (statically) the position of build plate 111 at any angle.

Build plate 111 is a platform comprising hardware on which article 151 is fabricated. Build plate 111 is configured to receive heated filament deposited by deposition head 122.

Robot 121 is capable of depositing a segment of fiber-reinforced thermoplastic filament from any three-dimensional coordinate in build chamber 102 to any other three-dimensional coordinate in build chamber 102 with deposition head 122 at any approach angle. To this end, robot 121 comprises a multi-axis (e.g., six-axis, seven-axis, etc.), mechanical arm that is under the control of controller 101. Software for controller 101 generates tool paths to create three dimensional articles of manufacture having three dimensional infills as addressed further herein. The mechanical arm comprises first arm segment 123, second arm segment 124, and third arm segment 125. The joints between adjoining arm segments are under the control of controller 101. A non-limiting example of robot 121 is the IRB 4600 robot offered by ABB.

The mechanical arm of robot 121 can move deposition head 122 in:
 i. the +x direction,
 ii. the −x direction,
 iii. the +y direction,
 iv. the −y direction,
 v. the +z direction,
 vi. the −z direction, and
 vii. any combination of i, ii, iii, iv, v, and vi,
while rotating the approach angle of deposition head 122 around any point or temporal series of points. While the present application is explained utilizing an x, y, z coordinate system, it will be appreciated the present teachings can be translated to other coordinate systems if desired. Further techniques for three dimensional tool path generation are addressed in the U.S. Application Serial Nos. listed below and incorporated by reference. Further, while the robot 121 can be controlled as addressed above, it can also be more simply implemented and controlled more simply in an xy plane and then stepped up a step in the z plane, an operation sometimes referred to as 2.5D. However, the three dimensional infill contemplated herein includes three dimensional travel along the infill tool path for at least some segments of infill.

Deposition head 122 comprises hardware that is under the control of controller 101 and that deposits fiber-reinforced thermoplastic filament 131. Deposition head 122 is described in detail in pending United States Patent Applications:
 (i) Ser. No. 15/827,721, entitled "Filament Guide," filed on Nov. 30, 2017;
 (ii) Ser. No. 15/827,711, entitled "Filament Heating in 3D Printing Systems," filed on Nov. 30, 2017;
 (iii) Ser. No. 15/854,673, entitled "Alleviating Torsional Forces on Fiber-Reinforced Thermoplastic Filament," filed on Dec. 26, 2017;
 (iv) Ser. No. 15/854,676, entitled "Depositing Arced Portions of Fiber-Reinforced Thermoplastic Filament," filed Dec. 26, 2017;
all of which are incorporated by reference in their entirety and particularly for the purpose of describing additive manufacturing system 100 in general, and deposition head 122 in particular. The following patent applications are incorporated by reference for their description of how to make and use additive manufacturing system 100:
 U.S. patent application Ser. No. 15/438,559, filing date Feb. 21, 2017;
 U.S. patent application Ser. No. 15/375,832, filing date Dec. 12, 2016;
 U.S. patent application Ser. No. 15/232,767, filing date Aug. 9, 2016;
 U.S. patent application Ser. No. 14/574,237, filing date Dec. 17, 2014;
 and
 U.S. patent application Ser. No. 14/623,471, filing date Feb. 16, 2015.

Filament conditioning unit 129 comprises hardware that pre-heats filament 131 prior to deposition.

Filament 131 comprises a tow of reinforcing fibers that is substantially parallel to its longitudinal axis. In accordance with the illustrative embodiments, filament 131 comprises a cylindrical towpreg of contiguous 12K carbon fiber that is impregnated with thermoplastic resin. Thermoplastic filament 131 comprises contiguous carbon fiber, but it will be clear to those skilled in the art, after reading this disclosure, how to make and use alternative embodiments of the present invention in which thermoplastic filament 131 has a different fiber composition.

It will be clear to those skilled in the art, after reading this disclosure, how to make and use alternative embodiments of the present invention in which filament 131 comprises a different number of fibers (e.g., 1K, 3K, 6K, 24K, etc.). It will be clear to those skilled in the art, after reading this disclosure, how to make and use alternative embodiments of the present invention in which the fibers in filament 131 are made of a different material (e.g., fiberglass, aramid, carbon nanotubes, etc.).

In accordance with the illustrative embodiments, the thermoplastic is, in general, a semi-crystalline polymer and, in particular, the polyaryletherketone (PAEK) known as polyetherketone (PEK). In accordance with some alternative embodiments of the present invention, the semi-crystalline material is the polyaryletherketone (PAEK), polyetheretherketone (PEEK), polyetherketoneketone (PEKK), polyetheretherketoneketone (PEEKK), or polyetherketoneetherketoneketone (PEKEKK). As those who are skilled in the art will appreciate after reading this specification, the disclosed annealing process, as it pertains to a semi-crystalline polymer in general, takes place at a temperature that is above the glass transition temperature, Tg.

In accordance with some alternative embodiments of the present invention, the semi-crystalline polymer is not a polyaryletherketone (PAEK) but another semi-crystalline thermoplastic (e.g., polyamide (PA), polybutylene terephthalate (PBT), poly(p-phenylene sulfide) (PPS), etc.) or a mixture of a semi-crystalline polymer and an amorphous polymer.

When the filament comprises a blend of an amorphous polymer with a semi-crystalline polymer, the semi-crystalline polymer can be one of the aforementioned materials and the amorphous polymer can be a polyarylsulfone, such as polysulfone (PSU), polyethersulfone (PESU), polyphenylsulfone (PPSU), polyethersulfone (PES), or polyetherimide (PEI). In some additional embodiments, the amorphous polymer can be, for example and without limitation, polyphenylene oxides (PPOs), acrylonitrile butadiene styrene (ABS), methyl methacrylate acrylonitrile butadiene styrene copolymer (ABSi), polystyrene (PS), or polycarbonate (PC). As those who are skilled in the art will appreciate after reading this specification, the disclosed annealing process, as it pertains to a blend of an amorphous polymer with a semi-crystalline polymer, takes place generally at a lower temperature than a semi-crystalline polymer with the same glass transition temperature; in some cases, the annealing process can take place at a temperature slightly below the glass transition temperature.

When the filament comprises a blend of an amorphous polymer with a semi-crystalline polymer, the weight ratio of semi-crystalline material to amorphous material can be in the range of about 50:50 to about 95:05, inclusive, or about 50:50 to about 90:10, inclusive. Preferably, the weight ratio of semi-crystalline material to amorphous material in the blend is between 60:40 and 80:20, inclusive. The ratio selected for any particular application may vary primarily as a function of the materials used and the properties desired for the printed article.

In some alternative embodiments of the present invention, the filament comprises a metal. For example, and without limitation, the filament can be a wire comprising stainless steel, Inconel® (nickel/chrome), titanium, aluminum, cobalt chrome, copper, bronze, iron, precious metals (e.g., platinum, gold, silver, etc.).

To design an article of manufacture, such as article 151 or the ones shown in FIGS. 2-5 and 8, a human designer uses a computer-aided-design system (e.g., Dassault Systèmes SolidWorks®, etc.) to specify the desired spatial, structural, and other physical properties of the article of manufacture. The salient spatial features of a single slice of an article in the xy plane and the generation of a three dimensional infill therefor are depicted in FIGS. 2-5 and 7. The human designer and computer-aided-design system select an infill archetype for article 200 or 700, and generate a fully-custom infill based on the selected infill archetype for article 200 or 700 that satisfies the structural and other physical properties with the adaptations and modifications addressed further below.

Figure 2:
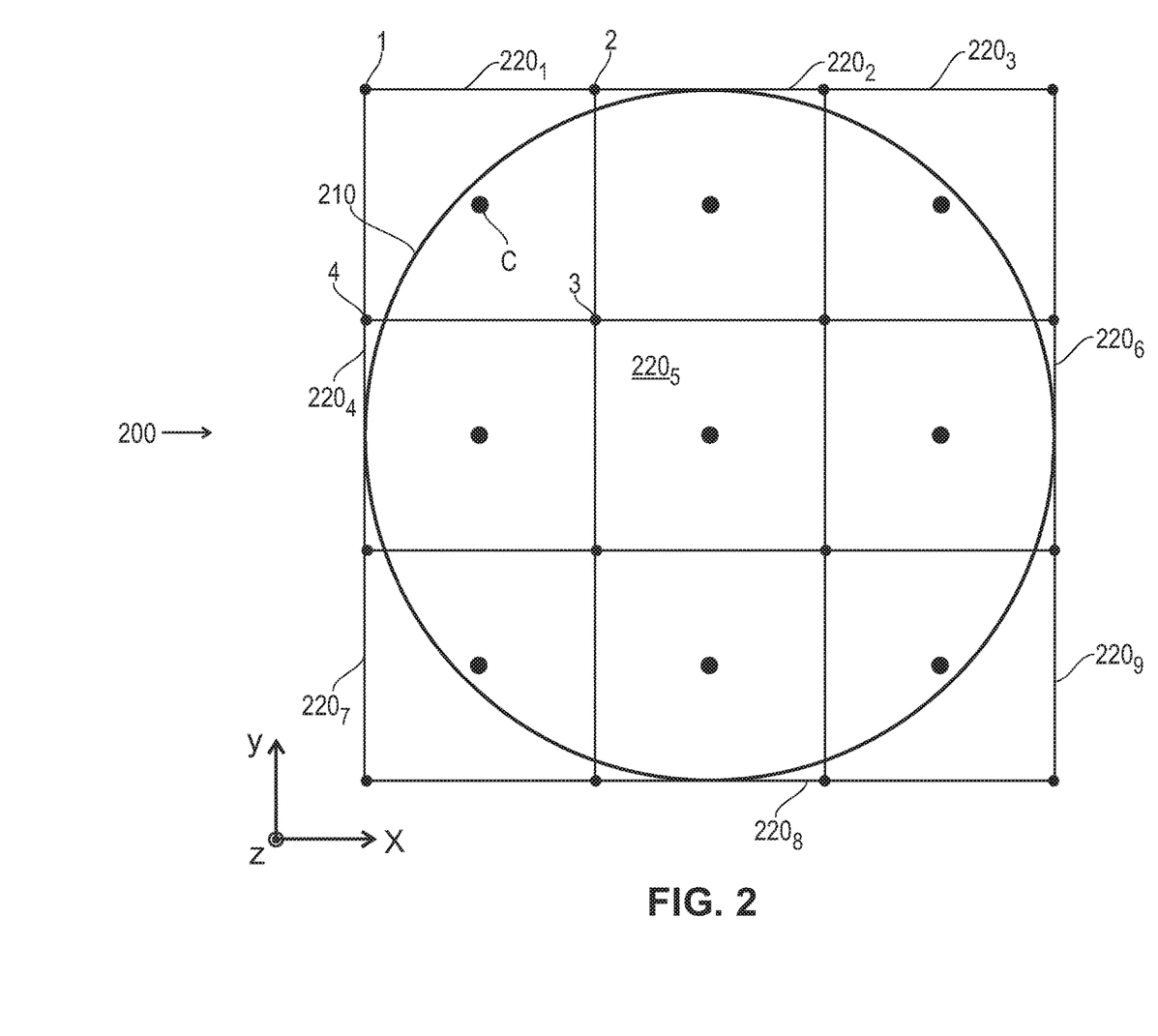
FIG. 2 shows a two dimensional slice of a cylindrical three dimensional article of manufacture or part with an exemplary array of voxels utilized to demonstrate aspects of the present invention.

FIG. 2 shows a slice in the xy plane of a part 200, a cylindrical tube or part that has a circular outer boundary 210 having a diameter of 24 units that is generated by creating concentric offset paths from the outline edges of the part 300 in a known manner. Only, an innermost article tool path forming boundary 200 with the hollow interior of the part is shown for ease of illustration.

As additionally shown in FIG. 2 a plurality of voxels $220_1$, $220_2$ . . . $220_9$ (collectively 220) are shown which circumscribe and fully cover the part 200. As illustrated each of these voxels is eight by eight by eight units. The part 200 and voxels 220 are three dimensional and extend along a z-axis which is into the page of FIG. 2 perpendicular to both the x and y axes as represented by bullet ⊙ in FIG. 2. It will be recognized that additional voxels $221_1$, $221_2$ . . . $221_9$ (collectively 221) and so on voxels $222_{1-n}$ (not shown) are employed as needed to cover the length of the part 210. Each voxel may be viewed as having eight corners or vertices, four of which are shown for each of the voxels $220_{1-9}$ and a center. It will be recognized that corners 2, 3 and 4 are shared with neighboring voxels and that the center C is four units into the page along the z-axis.

Figure 3:
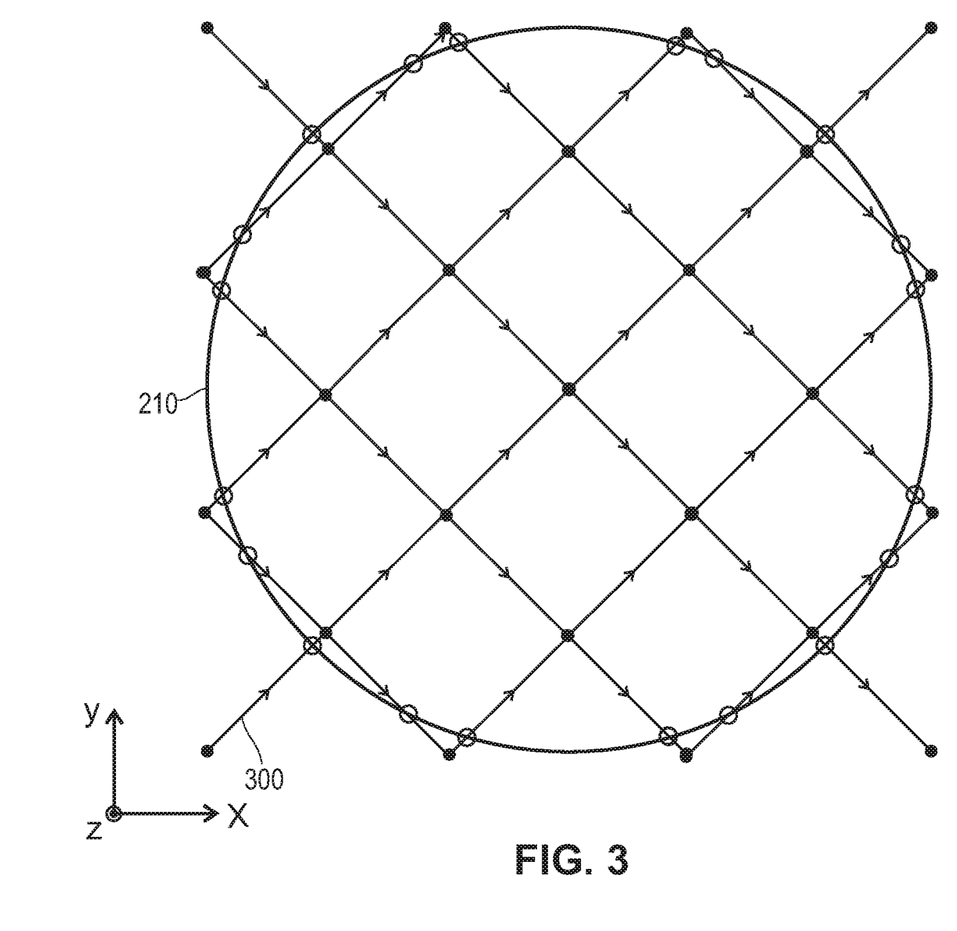
FIG. 3 shows a meta infill tool path passing through nodes of the voxels of FIG. 2.

FIG. 3 illustrates a first meta infill tool path 300 utilized as a starting point for generating an actual three dimensional infill tool path 400 (shown in FIG. 4) in accordance with the present invention as addressed further herein. Starting at lower left corner of voxel $220_7$, the meta tool path 300 proceeds to the center of voxel $220_7$, then meta tool path 300 proceeds to the lower right corner of voxel $220_7$ which is also the lower left corner of voxel $220_8$. From the lower left corner of voxel $220_8$, meta tool path 300 proceeds to the center of voxel $220_8$. From the center of voxel $220_8$, the meta tool path 300 proceeds to the lower right corner of voxel $220_8$ which is also the lower left corner of voxel $220_9$. From the lower left corner of voxel $220_9$, the meta tool path 300 proceeds to the center voxel $220_9$ and then from this center to the lower right corner of voxel $220_9$.

The meta tool path 300 then skips to the upper left corner of voxel $220_7$ and the zig zag pattern described above in connection with travel from lower left corner of voxel $220_7$ to the lower right corner of voxel $220_9$ is inverted and repeated as meta tool path 300 travels from upper left corner of voxel $220_7$ to the upper right corner of voxel $220_9$. As one alternative, the meta tool path 300 could skip to the upper right corner of voxel $220_9$ and proceed to the upper left corner of voxel $220_7$.

Upon reaching the upper right corner of voxel $220_9$, the meta tool path 300 skips to the upper left corner of voxel $220_7$ (which is also the lower left corner of voxel $220_4$) and the original zig zag pattern repeats until the upper right corner of voxel $220_9$ is reached. Meta path 300 then skips back to upper left corner of voxel $220_4$ and the inverted zig zag pattern repeats for travel from the upper left corner of voxel $220_4$ to the upper right corner of voxel $220_6$.

From the upper right corner of voxel $220_6$, the meta tool path skips to the lower left corner of voxel $220_1$ and the original zig zag pattern repeats for travel from the lower left corner of voxel $220_1$ to the lower right corner of voxel $220_3$. The meta fill tool path then skips to the upper left corner of voxel $220_1$ and the inverted zig zag repeats for travel from the upper left corner of voxel $220_1$ to the upper right corner of voxel $220_3$ completing the meta tool path 300.

Figure 4:
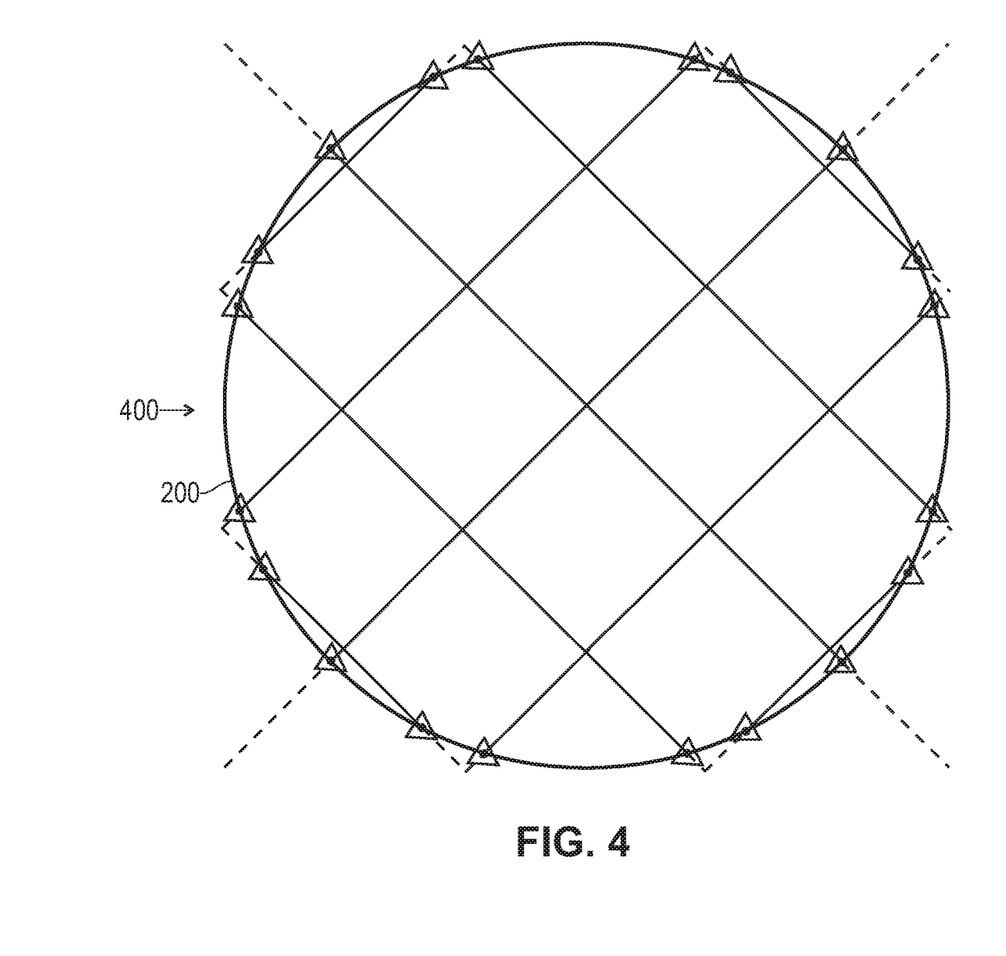
FIG. 4 shows intersection points of the meta infill tool path of FIG. 2 with the inner boundary of the part of FIG. 2 and anchor points for anchoring printed infill to the part.

It is seen that the meta tool path 300 intersects with the boundary 210 of part 200 at twenty points indicated by circles (○). It is recognized that parts of the meta infill tool path 300 cannot be part of any actual infill tool path as they are outside the boundary 210 of the part 200. These portions of meta tool path 300 are represented in FIG. 4 with dashed lines and are pruned from the actual tool path 400 shown in FIG. 4 which also includes anchoring points identified by triangles (Δ). In one alternative embodiment where the triangles are close together, for example, within a predetermined distance, an extended anchor may be employed along the arc of the boundary 210 connecting the two close triangles.

Figure 5:
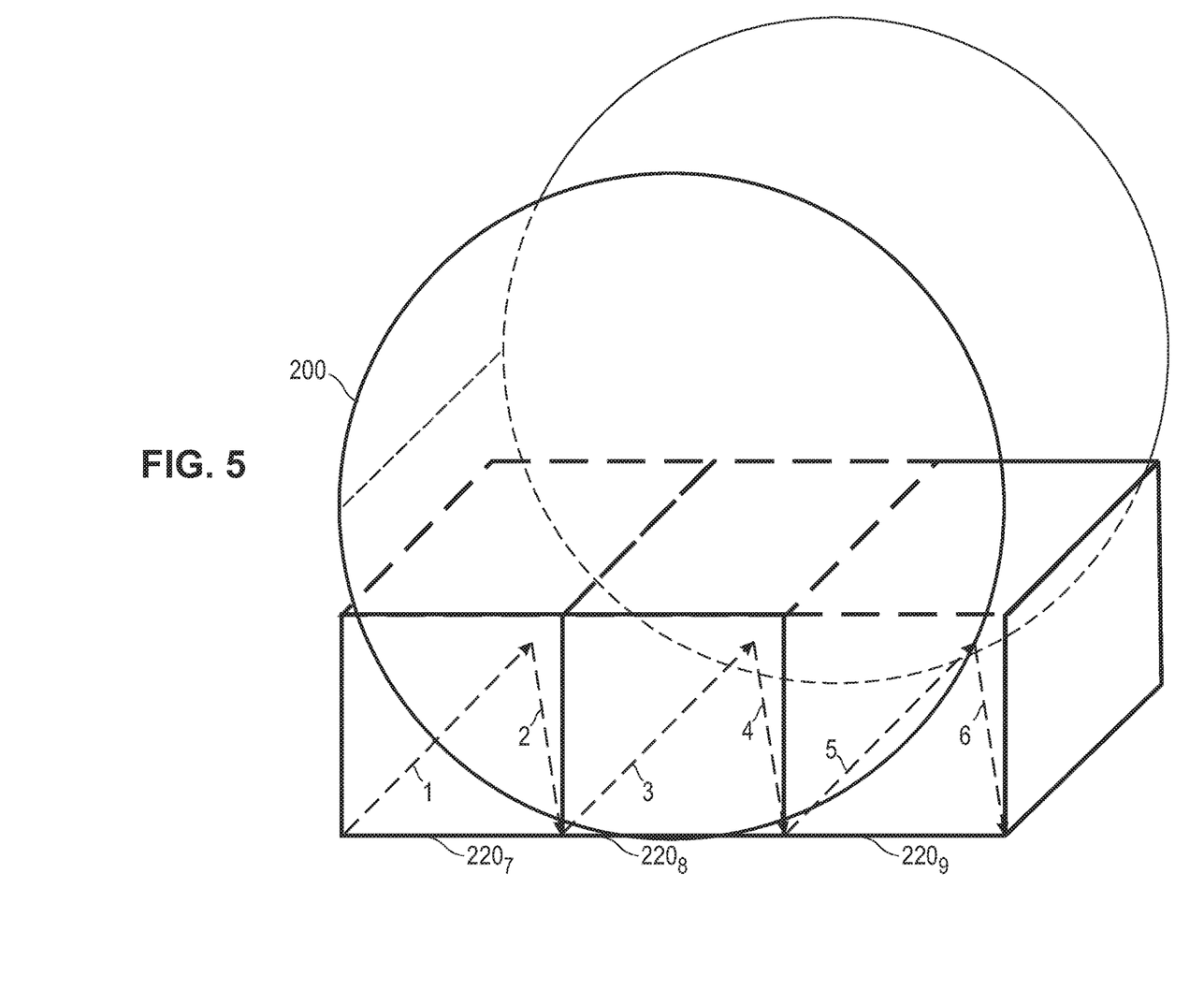
FIG. 5 shows a three dimensional representation of a portion of the cylindrical part and a portion of the meta tool path.

FIG. 5 represents part of the cylinder 200 and voxels $220_7$ and $220_8$ and $220_9$ in three dimensions with segments 1, 2, 3, 4, 5 and 6 forming the first part of meta infill path 300. It will be recognized that the cylinder may and will typically have additional depth in the z-direction. The depth shown is for ease of illustration.

Figure 6A:
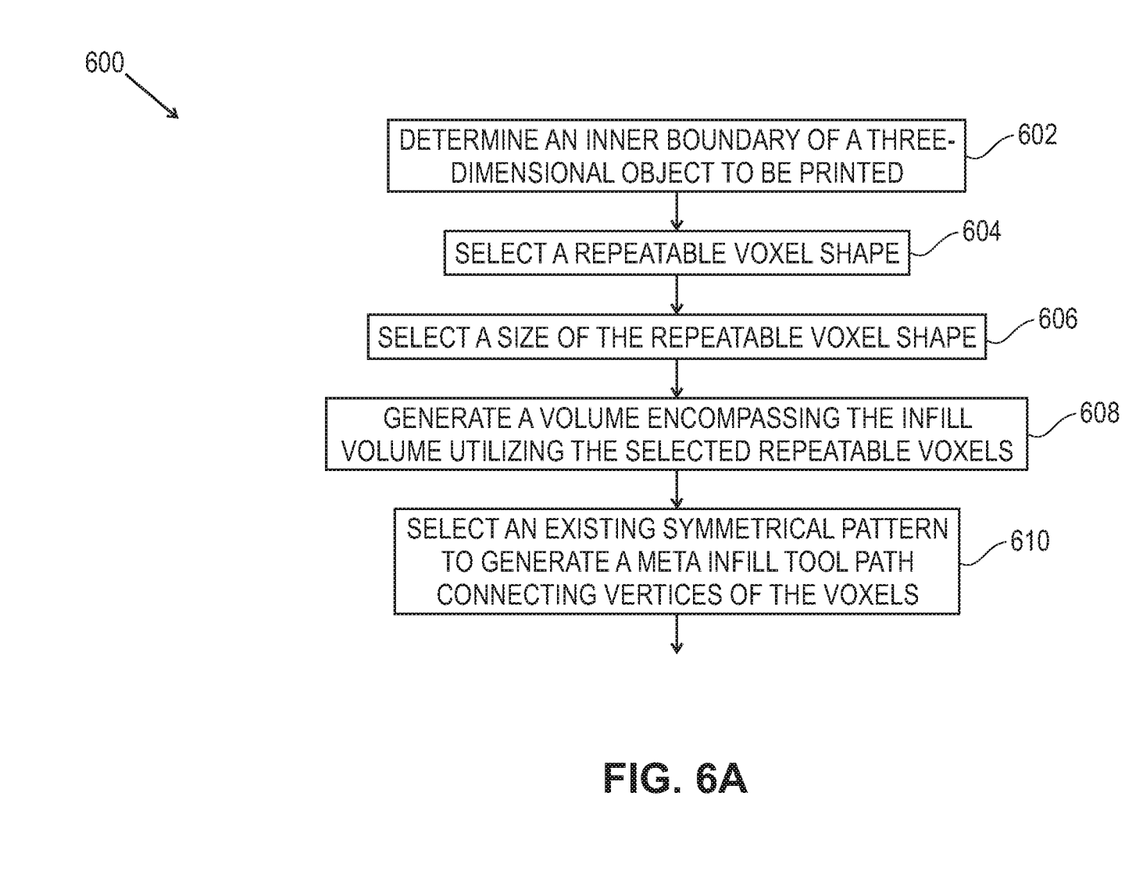
FIGS. 6A and 6B (collectively FIG. 6) show a flowchart of a process of generating a meta infill tool path and then generating a three dimensional infill tool path from the meta tool path in accordance with the present invention.
Figure 6B:
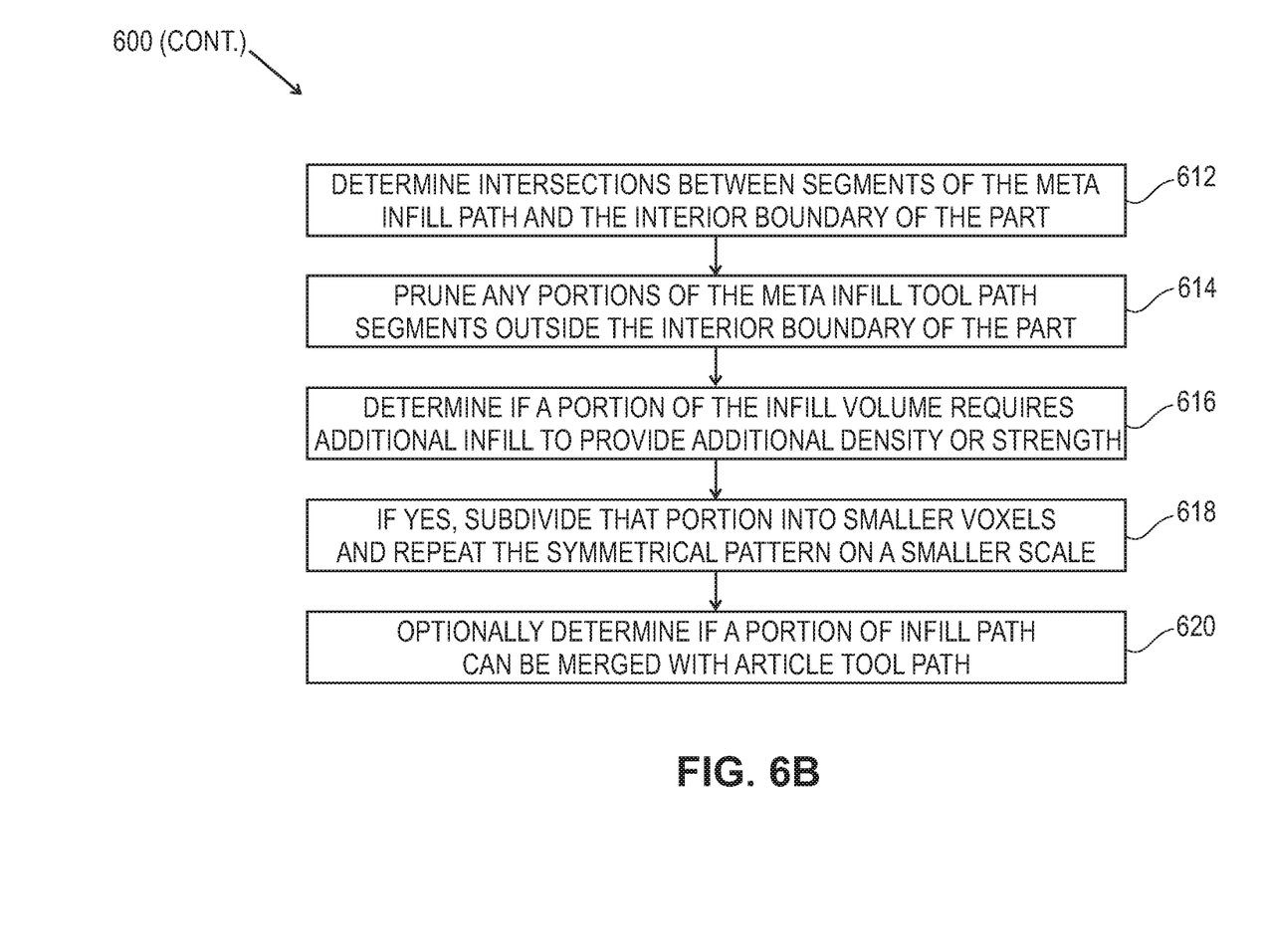

FIG. 6 shows a process 600 of generating a meta tool path, such as path 300. In step 602, an inner boundary of a three dimensional article to be three dimensionally printed is determined, such as cylinder 200 of FIGS. 2-5 or irregularly shaped object 700. Alternatively a boundary of an internal space bounded by a surface of the article is determined. In step 604, a repeatable voxel shape is selected. While the discussion of FIGS. 2-5 and 7 addresses cubes, other repeatable shapes such as pyramids, cuboids, tetrahedrons and octahedrons, for example, may be utilized as desired and the desired shapes are preferably selectable from a graphical user interface generated menu. In step 606, depending upon the strength of the infill desired, or put otherwise, depending upon the sparseness or density of infill required to provide the desired strength and weight tradeoff, the size of the voxels is selected in step 606. The strength of the infill desired may be evaluated using finite element analysis (FEA).

In FIGS. 2-5, the diameter of the cylinder 200 is 24 units and cubic voxels having a size of eight by eight by eight units were chosen for the purposes of illustration. It will be recognized for a sparse infill utilizing the process of the present invention a single cube having dimensions of at least 24×24×24 can be employed. Eight voxels of 12×12×12 could replace the one voxel of 24×24×24 to provide additional infill. 27 voxels of 8×8×8 per the example of FIG. 2 may be employed to provide additional infill strength at the cost of additional weight and so on.

While the above example assumes a regular infill pattern throughout an article's inner volume, it will be recognized that more infill may be desired in part of the article and less infill desired elsewhere. As an example, if the article is to be oriented in use so that part is the base and another part is the roof, both the base and roof might have additional infill support as taught herein. The approach of the present invention is readily adaptable to addressing such variations and to rapidly generate prototypes which may be tested as to their strength and weight tradeoffs.

Returning to FIG. 6 and process 600, in step 608, the repeatable voxels generated by steps 604 and 606 are utilized to generate a volume completely encompassing the entire interior volume of the part for which an infill pattern is to be generated. In step 610, an existing symmetrical pattern is selected to generate infill which connects meta anchor points on the voxels thereby generating a meta infill tool path. As seen in FIG. 2, by way of example, meta anchor points 1, 2, 3, 4, and C of voxel $220_1$ and the corresponding meta anchor points of voxels $220_{2-9}$ are utilized to generate the meta infill tool path 300 shown in FIG. 3, as described in detail above. It will be recognized vexels may have different symmetrical patterns to generate infill if desired.

In step 612, intersections between segments of the meta infill tool path and the interior boundary of the part are determined. Alternatively, intersections between the meta infill tool path and the boundary of the volume to be filled are determined.

In step 614, any portions of the meta infill tool path segments outside the interior boundary of the part or outside the boundary of the volume infilled are pruned away.

In step 616, it is determined if a portion of the infill volume requires additional infill to provide additional density and/or strength.

In step 618, if yes, any volume requiring additional strength is subdivided into smaller voxels and the symmetrical pattern is repeated on a smaller scale. Alternatively, a different symmetrical pattern might also be chosen.

Optionally, in step 620, it is determined whether the infill path can be partially or totally merged with the article tool path. As an example, rather than skipping from the lower right corner of voxel $220_9$ to the upper left corner of voxel $220_7$, the deposition head might proceed to the nearest point of the cylinder 200 and print a portion of the cylinder to reach a point near the upper left corner of voxel $220_7$.

Figure 7:
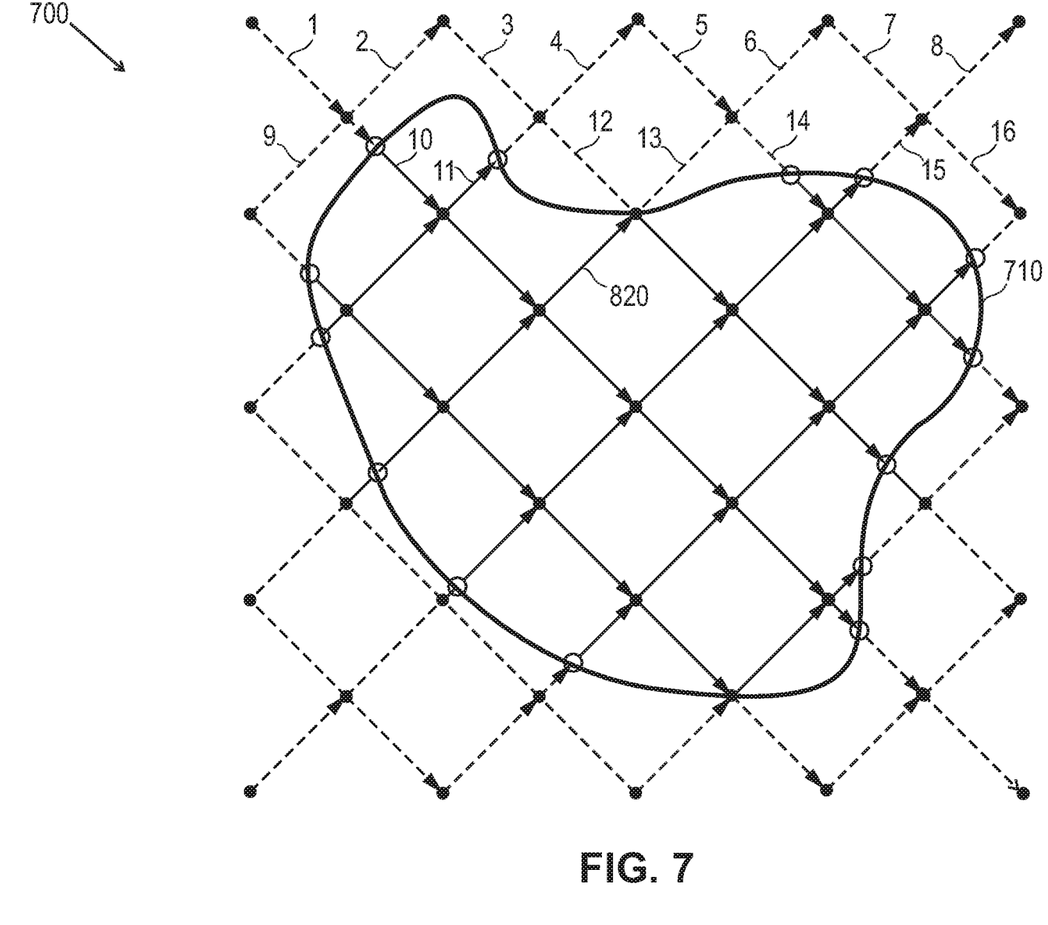
FIG. 7 shows a meta infill tool path and actual infill tool path for an irregularly shaped three dimensional part.

While the discussion of FIGS. 2-5 relates to a regularly shaped article, a cylinder, the approach described is readily adaptable to an irregularly shaped article 700 as shown in FIG. 7. FIG. 7 shows a slice in the xy plane of an article of manufacture or part 700 having an irregular perimeter 710 and customized infill 720 developed in a manner similar to that discussed in conjunction with FIGS. 2-5 and utilizing the process 600 of FIG. 6. As addressed above, first interior perimeter 710 of article 700 is surrounded by voxels. Then, a meta infill tool path is generated. In FIG. 7, the first 16 segments of that meta infill tool path are labeled 1-16. Anchor points indicated by circles (○) are identified where segments of the meta infill tool path intersect the perimeter 710. Exterior segments of the meta infill tool path identified by dashes ( - - - ) are pruned from the meta infill tool path leaving the infill tool path 720.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

For example, while the present invention is described in the context of presently preferred systems and materials, it will be recognized that these systems and materials are likely to evolve with time and that the disclosed solutions to problems are generally applicable to additive manufacturing contexts, where these problems arise so that various aspects of the present invention may be applied to materials other than fiber-reinforced thermoplastic filaments and the like.

Also, while many of the originally filed claims are directed to articles of manufacture, it will be understood that machines and processes are described herein and may also be claimed by this application or a continuation hereof

What is claimed is:

1. An article of manufacture formed by three-dimensional printing of lengths of filament along an article tool path to form an article, the article having a three-dimensional infill formed by a process comprising the steps of:
    determining a boundary of an internal space bounded by the article;
    selecting a repeatable voxel shape;
    selecting a size of the repeatable voxel shape to provide a predetermined strength and weight of the infill;
    generating a volume from voxels by repeating the repeatable voxel shape and according to the selected size, so that the volume fully encompasses the internal space bounded by the article;
    generating a meta infill tool path by using a symmetrical pattern defined by the voxels, wherein the symmetrical pattern connects meta anchor points on the voxels, including connecting (i) a first meta anchor point that is a corner point shared by at least two of the voxels in the volume and (ii) a second meta anchor point that is a center point of one of the voxels, wherein the first meta anchor point is outside the boundary;
    determining intersections between segments of the meta infill tool path and the boundary;
    generating a three-dimensional infill tool path by pruning any segments of the meta infill tool path outside the boundary, pruning any meta anchor points outside the boundary, including the first meta anchor point, and establishing new anchor points at the intersections; and
    printing the infill by utilizing the three-dimensional infill tool path.

2. The article of manufacture of claim 1 wherein the repeatable voxel shape is a cube.

3. The article of manufacture of claim 1 wherein the repeatable voxel shape is selected from a menu of shapes including cube, cuboid, pyramid, tetrahedron and octahedron.

4. The article of manufacture of claim 1 wherein the size of the repeatable voxel shape varies to adjust strength of the infill.

5. The article of manufacture of claim 4 wherein the strength of the infill is varied based upon a finite element analysis of a volume to be filled by the infill.

6. The article of manufacture of claim 1 further comprising connecting points of the repeatable voxel shape in a repeatable pattern.

7. The article of manufacture of claim 1 wherein the repeatable voxel shape is a cube having eight corner points and a center point and the infill tool path connects all the corner and center points in a repeatable, regular pattern.

8. A system of printing a three-dimensional article fabricated from a series of additive material runs, the additive material runs comprising lengths of filament, the article having a three-dimensional printed infill, the system comprising:
    a programmed computer for analyzing the article to determine a boundary of an internal space bounded by the article;
    a memory for storing a library of repeatable voxel shapes;
    a selectable menu utilized to select a repeatable voxel shape from the library;
    a selectable menu utilized to select a size of the repeatable voxel shape to provide a predetermined strength and weight of an infill;
    the programmed computer also being for generating a volume from voxels by repeating the repeatable voxel shape and according to the selected size, so that the volume fully encompasses the internal space bounded by the article;
    the programmed computer also being for generating a meta infill tool path by using a symmetrical pattern defined by the voxels, wherein the symmetrical pattern connects meta anchor points on the voxels, including connecting (i) a first meta anchor point that is a corner point shared by at least two of the voxels in the volume and (ii) a second meta anchor point that is a center point of one of the voxels, wherein the first meta anchor point is outside the boundary;
    the programmed computer also being for determining intersections between segments of the meta infill tool path and the boundary;
    the programmed computer also being for generating a three-dimensional infill tool path by (i) pruning any segments of the meta infill tool path outside the boundary, (ii) pruning any meta anchor points outside the boundary, including the first meta anchor point, and (iii) establishing new anchor points at the intersections; and
    a print head for printing the infill by utilizing the three-dimensional infill tool path.

9. The system of claim 8 wherein the filament of the article comprises lengths of fiber-reinforced filament and the infill is formed from a different material than the fiber-reinforced filament.

10. The system of claim 8 wherein the library of repeatable voxel shapes comprises cubes, cuboids, pyramids, tetrahedrons, and octahedrons.

11. The system of claim 8 where a larger size of the repeatable voxel shape is selected for a volume requiring a weaker, lighter infill and a smaller size of the repeatable voxel shape is selected for a volume requiring a stronger, heavier infill.

12. The system of claim 8 wherein the infill has a strength determined based upon a finite element analysis of the article.

13. A computer-controlled method of printing a three-dimensional article fabricated from a series of additive material runs, the article having a three-dimensional printed infill, the additive material runs comprising lengths of filament, the method comprising:
    determining a boundary of an internal space bounded by the article;
    selecting a repeatable voxel shape;
    selecting a size of the repeatable voxel shape to provide a predetermined strength and weight of an infill;
    generating a volume from voxels by repeating the repeatable voxel shape and according to the selected size, so that the volume fully encompasses the internal space bounded by the article;
    generating a meta infill tool path by using a symmetrical pattern defined by the voxels, wherein the symmetrical pattern connects meta anchor points on the voxels, including connecting (i) a first meta anchor point that is a corner point shared by at least two of the voxels in the volume and (ii) a second meta anchor point that is a center point of one of the voxels, wherein the first meta anchor point is outside the boundary;

determining intersections between segments of the meta infill tool path and the boundary;

generating a three-dimensional infill tool path by pruning any segments of the meta infill tool path outside the boundary, pruning any meta anchor points outside the boundary, including the first meta anchor point, and establishing new anchor points at the intersections; and printing the infill by utilizing the three-dimensional infill tool path.

14. The method of claim 13 wherein the repeatable voxel shape is a cube.

15. The method of claim 13 wherein the repeatable voxel shape is selected from a menu of shapes including cube, cuboid, pyramid, tetrahedron, and octahedron.

16. The method of claim 13 wherein the size of the repeatable voxel shape is varied to adjust strength of the infill.

17. The method of claim 16 wherein the strength of the infill is varied based upon a finite element analysis of a volume to be filled by the infill.

18. The method of claim 13 further comprising connecting points of the repeatable voxel shape in a repeatable pattern.

19. The method of claim 13 wherein the repeatable voxel shape is a cube having eight corner points and a center point and the infill tool path connects the corner and center points in a repeatable, regular pattern.

* * * * *